United States Patent [19]

Deaver et al.

[11] 4,230,986
[45] Oct. 28, 1980

[54] APPARATUS FOR FACILITATING THE SERVICING OF PRINTED CIRCUIT BOARDS

[75] Inventors: Richard A. Deaver; Ralph C. Eifort; John A. Nagel, all of Wichita, Kans.

[73] Assignee: NCR Corporation, Dayton, Ohio

[21] Appl. No.: 970,768

[22] Filed: Dec. 18, 1978

[51] Int. Cl.³ ............................................. G01R 31/22
[52] U.S. Cl. ........................... 324/158 F; 324/73 PC; 339/17 CF; 339/17 M; 361/415
[58] Field of Search ................ 324/158 F, 73 PC, 51; 339/17 M, 17 CF, 76; 361/390, 415; 206/331, 334; 174/138 G; 117 F

[56] References Cited

U.S. PATENT DOCUMENTS

| | | | |
|---|---|---|---|
| 3,147,054 | 9/1964 | Alexander et al. | 339/17 |
| 3,147,402 | 9/1964 | Hochstetler | 361/388 |
| 3,188,524 | 6/1965 | Williams | 361/390 |
| 3,440,593 | 4/1969 | Karras et al. | 339/17 |
| 3,549,995 | 12/1970 | Trousdale et al. | 324/73 |
| 3,656,058 | 4/1972 | Leathers | 324/158 F |
| 3,662,225 | 5/1972 | Carter | 339/17 M X |
| 3,701,077 | 10/1972 | Kelly, Jr. | 324/158 F X |
| 3,728,662 | 4/1972 | Puri | 339/17 LM |
| 4,026,412 | 5/1977 | Henson | 324/158 F X |
| 4,077,688 | 3/1978 | Cobaugh et al. | 339/74 R |

*Primary Examiner*—Stanley T. Krawczewicz
*Attorney, Agent, or Firm*—J. T. Cavender; Albert L. Sessler, Jr.; Elmer Wargo

[57] ABSTRACT

An apparatus for facilitating the servicing of a printed circuit board which is removed from a support structure. An extender board is inserted into the space from which the board to be serviced is removed, and the extender board has zero-insertion-force connectors thereon to provide electrical connections to the board to be serviced. A collapsible support is used to support the board being serviced, and additional power connections are supplied to enable the board being serviced to maintain normal board-to-board signal flow while being examined outside of the support structure.

9 Claims, 5 Drawing Figures

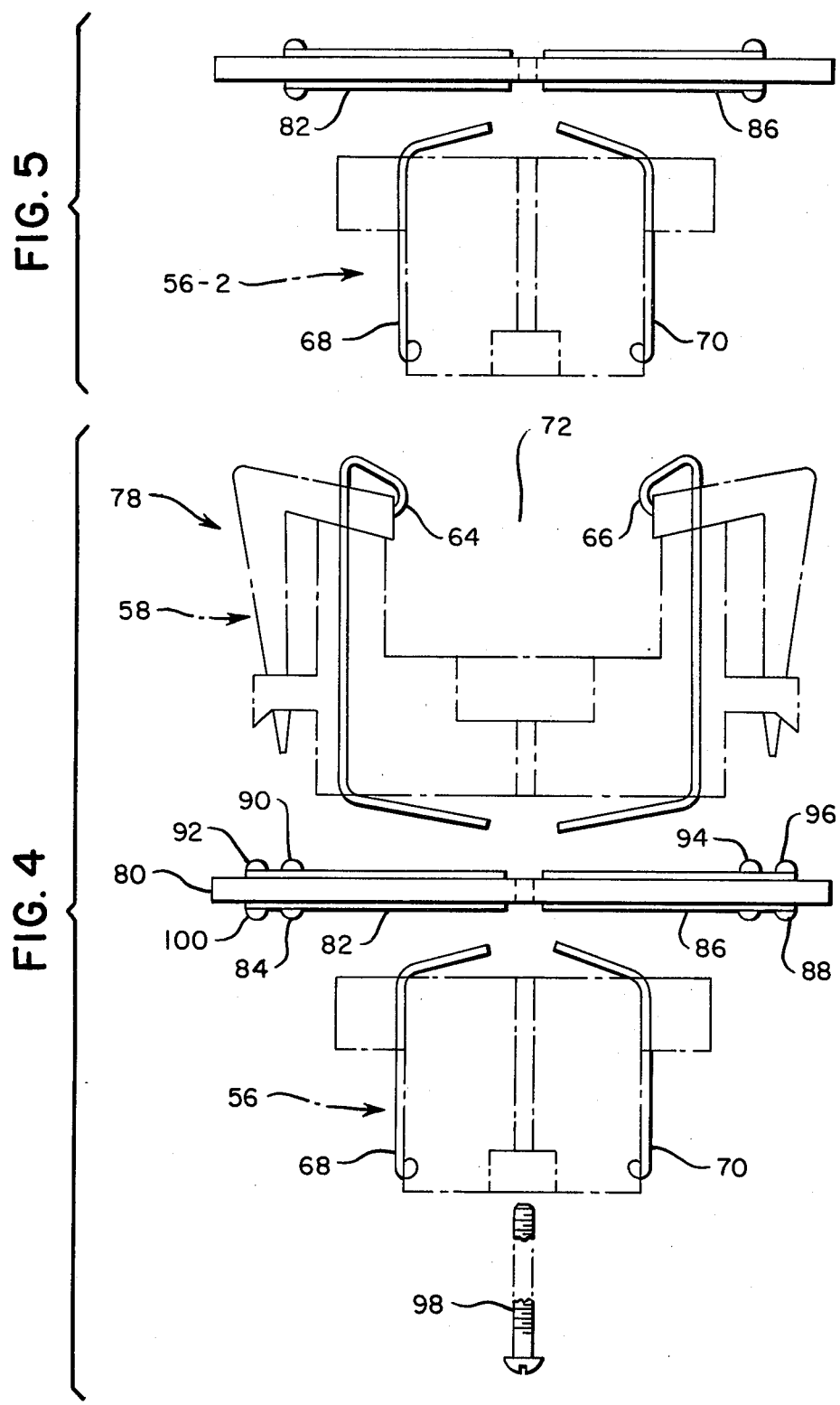

APPARATUS FOR FACILITATING THE SERVICING OF PRINTED CIRCUIT BOARDS

BACKGROUND OF THE INVENTION

This invention relates to an apparatus for facilitating the servicing and/or testing of a printed circuit board which is removed from its normal mounting position in a piece of equipment but is electrically interconnected with the equipment so as to enable dynamic testing of the removed circuit board.

Recently, certain inter-board connector arrangements have been used to provide the electrical connections between adjacent printed circuit boards which are housed in a support structure without an interconnecting element which is commonly referred to as a "back panel". One such inter-board connector arrangement is shown in U.S. patent application Ser. No. 877,432 which was filed on Feb. 13, 1978 and is assigned to the same assignee as is the present invention. The inter-board connector arrangement mentioned generally has a female connector member located on one side of a circuit board and a male connector member located on the opposite side of the board. The electrical contacts on the female member on one circuit board are displaced somewhat through an actuating means to permit the male member located on the next adjacent circuit board to be inserted into the female member with zero-insertion-force (ZIF), and when the male and female members are aligned to provide the contact-to-contact, electrical connections, the actuating means is again utilized to permit the contacts on the female member to engage the corresponding contacts on the male member to provide the electrical connections therebetween.

SUMMARY OF THE INVENTION

This invention relates to an apparatus for facilitating the servicing and/or testing of a printed circuit board which is removed from its support structure in a device which has a plurality of circuit boards which are slidably mounted in spaced parallel relationship in the support structure. The circuit boards are electrically intercoupled by means comprising a first member on one side of a circuit board and a second member located on the opposite side thereof, whereby the first member of one circuit board is brought into coupling relationship with a said second member of a first adjacent circuit board and the second member on the one circuit board is brought into coupling relationship with a said first member on a second adjacent circuit board as the one circuit board is moved into the support structure.

A means for supporting one of the circuit boards (hereinafter referred to as the board under test) after it is removed from its space within the support structure is also provided.

A coupling means (such as an extender board) having a first member on one side thereof and a second member located on the opposite side thereof is also utilized whereby the first member of the coupling means is brought into coupling relationship with the second member of said first adjacent circuit board and the second member on said coupling means is brought into coupling relationship with the first member on said second adjacent circuit board as said coupling means is moved into said space from which said board under test is removed.

The apparatus also includes first means for electrically coupling the first member on said coupling means with the first member on said board under test, and second means for electrically coupling the second member on said coupling means with the second member on the board under test whereby the board under test is operatively coupled to the first and second adjacent circuit boards to facilitate testing, servicing and the like on said board under test.

The apparatus of this invention provides a means for testing and/or servicing a circuit board for those devices which do not employ what is commonly referred to as a "back panel", but do employ an inter-board connector of the type previously mentioned herein.

The means for supporting the circuit board under test is a collapsible means in a preferred embodiment described herein.

These advantages and others will be more readily understood in connection with the following detailed description, claims, and drawing.

BRIEF DESCRIPTION OF THE DRAWING

FIG. 4 is a partially-exploded end view, in schematic form, taken along the line 4—4 of FIG. 1, to show the electrical contacts of a male member and a female member located on said coupler; and FIG. 5 is a partially-exploded end view of a said male member used in said apparatus.

DETAILED DESCRIPTION OF THE INVENTION

Figure 1:
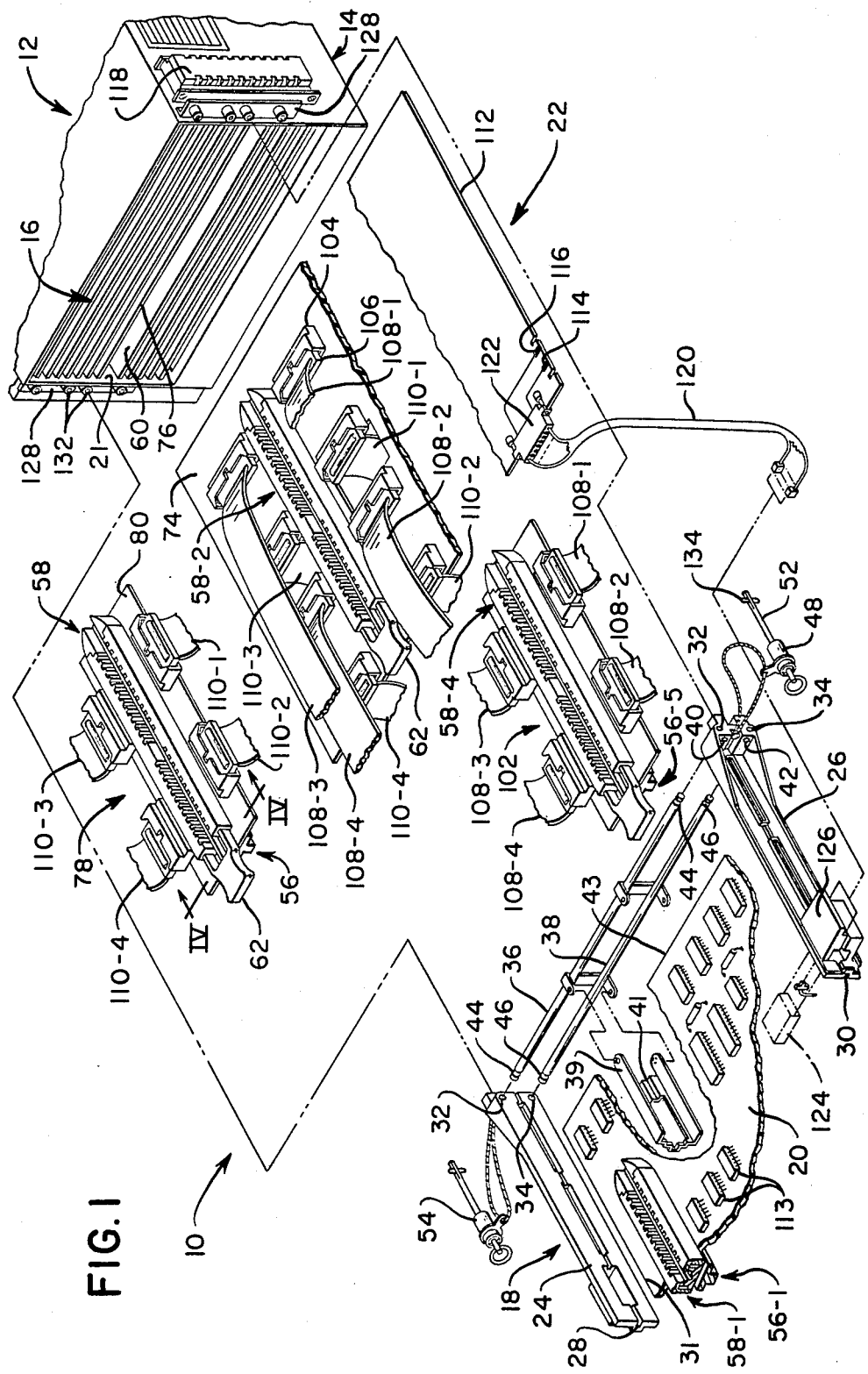
FIG. 1 is a general, exploded-assembly view, shown in perspective, of the apparatus of this invention.

FIG. 1 is a general, exploded-assembly view, in perspective, of a preferred embodiment of the apparatus of this invention which is designated generally as 10. The apparatus 10 may be utilized with a device 12 having a support structure 14 (like a card cage) in which a plurality 16 of circuit boards is slidably mounted. The apparatus 10 includes a means 18 for supporting a printed circuit board 20 (shown partially broken away to facilitate the showing of the supporting means 18), a coupling means 22 (like an extender board) and various means thereon for electrically coupling the circuit board 20 with the device 12 while the circuit board 20 is removed therefrom to enable the circuit board 20 to maintain normal, board-to-board signal flow while the board 20 is examined outside of the support structure 14.

The means 18 (FIG. 1) for supporting a circuit board (like 20) which has been removed from its space 21 within the support structure 14 to be tested or serviced, includes first and second support members 24 and 26, each having a recess 28 and 30, respectively, therein to receive opposed edges (like edge 31) of the board 20.

Each of the support members 24 and 26 (FIG. 1) has first and second holes 32 and 34 in one end to receive the ends of rods 36 and 38 which are utilized to maintain the support members 24 and 26 in spaced parallel relationship with each other and to support the opposed edges (like 31) of the board 20 in the recesses 28 and 30. Each of the support members 24 and 26 also has third and fourth holes 40 and 42 therein which are located at right angles to the associated holes 32 and 34, respectively, and are arranged to at least partially intersect the associated holes 32 and 34. Each of the rods 36 and 38 has an annular recess 44 and 46, respectively, formed near each end thereof.

Figure 2:
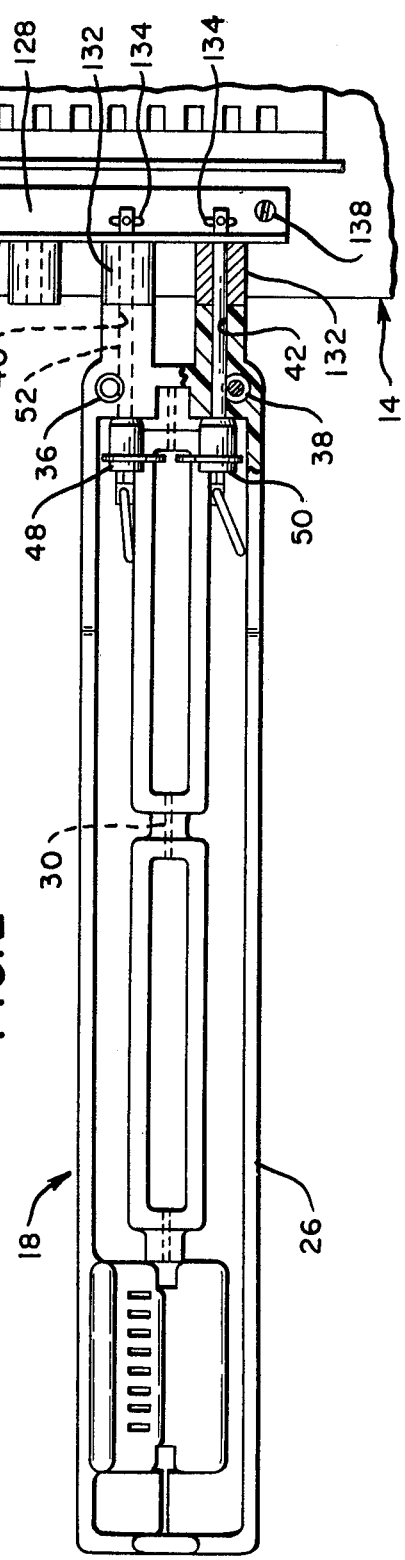
FIG. 2 is a side view of a means for supporting a circuit board under test and for securing it to a support structure.

The means 18 (FIG. 1) for supporting a circuit board 20 is collapsible and is assembled in the following manner. The rods 36 and 38 are inserted into the holes 32 and 34 of the support member 26, for example, and then locking pins 48 and 50 (FIG. 2) are utilized to secure these rods to the support member 26. The locking pin 48, for example, has a shaft 52 which is inserted partially into the hole 40, and the associated annular recess 44 near one end of rod 36 is then aligned with the shaft 52 to enable the periphery of the shaft 52 to engage the recess 44 to thereby lock the rod 36 within the support member 26 as is best seen in FIG. 2. The locking pin 50 similarly locks the rod 38 within the support member 26. An edge of the circuit board 20 is then placed within the recess 30 of the support member 26, and the opposed edge 31 of the board is aligned with the recess 28 of the support member 24 as the rods 36 and 38 are inserted into the first and second holes 32 and 34, respectively, of the support member 24. A locking pin 54 (FIG. 1) identical to locking pins 48 and 50 is similarly utilized to secure the rod 36 within the support member 24, and another locking pin (not shown) is utilized to secure the rod 38 within the support member 24 and thereby support circuit board 20 within the supporting means 18. An optional central support 39 (shown displaced 90 degrees from its actual position in use) has a recess 41 therein to receive the edge 43 of the circuit board 20 to provide additional support for the board within the supporting means 18.

Earlier herein, it was stated that certain inter-board connector arrangements have been used to provide the electrical connections between adjacent printed circuit boards which are housed in a support structure without an interconnecting element which is commonly referred to as a "back panel". One such inter-board connector arrangement includes a first or male member designated generally as 56 (FIG. 1) and a second or female member designated generally as 58. The circuit boards (like 20) which are interconnected via this interboard connector arrangement have a male member 56-1 on one side of the board and a female member 58-1 on the opposite side as shown in FIG. 1. The male and female members 56-1 and 58-1 are aligned so that their long dimensions are parallel to an edge like 31 of the associated circuit board 20, and they are located on the individual circuit boards so that the male member 56-1 of one circuit board (like 20) is aligned with the female member (not shown) of the next adjacent circuit board like board 60 within the support structure 14 as the circuit boards are moved into and out of the support structure 14.

The inter-board connector arrangement including the male and female members 56 and 58, respectively, are of the zero-insertion-force (ZIF) type. To accomplish zero-insertion force, the female member 58 has an actuating means 62, which when pulled outwardly of the member 58 causes the contacts like 64 and 66 (FIG. 4) to be moved away from each other to enable the contacts 68 and 70 of the male member like 56-2 of a next adjacent circuit board to be inserted into the recess 72 of the female member 58. After the male member 56-2 is inserted into the associated female member 58 and aligned therein, the actuating means 62 is then pushed into the female member 58, permitting the contacts 64 and 66 on the female member 58 to engage the associated contacts 68 and 70, respectively, on the associated male member 56-2. All the male members like 56, 56-1 etc. are identical, and similarly, all the female members like 58, 58-1 etc. are identical; however, they are given different dash numbers (like -1, -2) to distinguish among different male and female members within the drawing.

The coupling means 22 alluded to earlier herein includes a circuit board 74 (FIG. 1) which has the same size as the circuit board 20 which is to be serviced or tested. The circuit board 74 has a male member 56-3 (not shown) located on the underside of the board 74 and a female member 58-2 located on the opposite side as shown in FIG. 1. When the board 74 is inserted into the space 21 in the support structure 14, the male member 56-3 (not shown) on the lower side of the board 74 engages the female member 58-3 (not shown) on the first adjacent circuit board 60 in the support structure 14, and the female member 58-2 on the board 74 engages the male member 56-4 (not shown) on the second adjacent circuit board 76 located in the support structure. When the board 74 is inserted all the way into the support structure 14 (to align the contacts of the associated male and female members) the actuating means 62 on the associated female members (58-2, 58-3) are pushed inwardly to thereby electrically couple the male member 56-3 and the female member 58-2 with the first adjacent circuit board 60 and the second adjacent circuit board 76.

Figure 3:
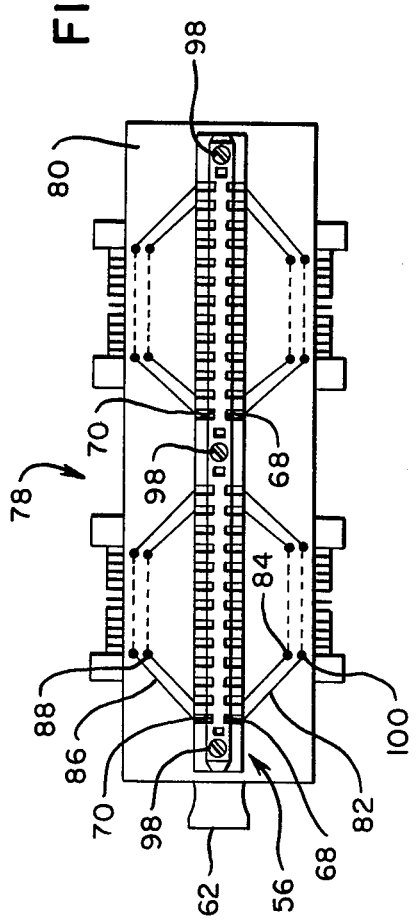
FIG. 3 is a plan view of one side of a coupler used in said apparatus, showing a male connector thereon.

The construction for effecting electrical connections between the male member 56, the female member 58, and the associated printed circuit boards like 20 is best shown in FIGS. 3 and 4. The coupler designated generally as 78 in FIGS. 1, 3, and 4 has the male member 56 and the female member 58 mounted on opposed sides of a planar member 80 made of electrically insulating material. The planar member 80 has a plurality of electrical conductors 82 and 84 thereon to engage the contacts 68 on one side of the male member 56, and a plurality of electrical conductors 86 and 88 to engage the contacts 70 on the other side of the male member 56. Similarly, the opposite side of the planar member 80 has a plurality of conductors 90 and 92 to engage the contacts 64 along one side of the female member 58 and a plurality of conductors 94 and 96 to engage the contacts 66 along the other side of the female member 58. The male and female members 56 and 58, respectively, are shown only in phantom outline in FIG. 4 to facilitate the showing of the interconnections between these male and female members and the various conductors on the planar member 80. Several fasteners like 98 are used to secure the male and female members 56 and 58 to the planar member 80 and to engage the associated conductors thereon. Each of the conductors 82, 84, 86, 88, 90, 92, 94 and 96 has a "plated through" portion (like portion 100 on conductor 82 in FIGS. 3 and 4) to facilitate interconnections from one side of the planar member 80 to the other side thereof and also from the male member 56 to the female member 58. While these interconnections are shown for the coupler 78, these same interconnections are used on the coupling means 22, the printed circuit boards (like 20) and the coupler 102 which is identical to coupler 78.

The coupling means 22 (FIG. 1) also includes conventional connectors like connector 104 which is operatively connected to a portion of the contacts 66 (FIG. 4) and a detachable mating connector 106 having a multiconductor flexible cable 108-1 secured thereto. In the embodiment being described, there are fifty pairs of opposed contacts like 64 and 66 in the female member 58 shown in FIG. 4 to provide 100 individual connections; however, the actual number of individual contacts used depends, of course, on a particular application in which the apparatus 10 is used. Flexible cable 108-1 has 25 conductors therein which are connected to 25 of the contacts 66 on the female connector 58-2, and similarly, flexible cable 108-2 has 25 conductors therein which are connected to the remaining 25 of the contacts 66. The flexible cable 108-3 and the flexible cable 108-4 similarly, each handle 25 of the contacts 64 of the female member 58-2. The male member 56-3 (not shown) on the underside of the coupling means 22 utilizes the same technique as first described for connecting 25 of the contacts 70 (FIG. 4) to each of the flexible cables 110-1 and 110-2, and for connecting 25 of the contacts 68 (FIG. 4) to each of the flexible cables 110-3 and 110-4. The connectors 104 and the mating connectors 106 are utilized throughout the coupling means 22 and the couplers 78 and 102 for the purposes described. The contacts 64 and 66 of the female member 58-1 and the contacts 68 and 70 of the male member 56-1 on the circuit board 20 are connected to each other or to the components (like 113) on the circuit board 20 according to circuit requirements.

In order to simplify the showing of the apparatus 10 in FIG. 1, the flexible cables like 108-1 are shown as being discontinuous when extending from the coupling means 22; however, the remaining ends of the cables 108-1 through 108-4 are actually connected to the coupler 102 which is identical in construction to coupler 78 which has been already described. The cables 108-1 through 108-4 coming from the female member 58-2 on the coupling means 102 are operatively connected to the male member 56-5 located on the coupler 102; the female member 58-4 on the coupler 102 is not used. The flexible cables 110-1 through 110-4 which are connected to the male member 56-3 (not shown) on the coupling means 22 are operatively connected to the female member 58 located on the coupler 78 by the techniques already described; the male member 56 on the coupler 78 is not used.

The coupling means 22 (FIG. 1) has an edge 112 of the board 74 with contacts like 114 and 116 thereon, which coact with a power distribution bus 118 to supply a plurality of voltage levels to the board 74. Each of the circuit boards like 20 has a plurality of contacts like 114 and 116 shown on board 74 to coact with the power distribution bus 118 when the circuit boards are inserted into the support structure 14.

In order to provide the various power voltage levels required when operating the circuit board 20 (FIG. 1) outside of the support structure 14, a conventional flexible cable 120 operatively connecting the coupling means 22 with the circuit board 20 is used. The cable 120 has a connector 122 on one end thereof which is connected to the contacts like 114 and 116 (only 2 of several are shown to simplify the drawing), and the cable has a connector 124 on the other end which is connected to the associated contacts (like 114 on 116 on board 74) on circuit board 20. The connector 124 is located within a housing 126 located on the first support member 26 to connect the circuit board 20 to the power distribution bus 118 when the circuit board 20 is retained within the supporting means 18.

After the coupling means 22 is inserted into the space 21 (left by the removal of circuit board 20) in the support structure 14, the female member 58-2 thereon is aligned with the male member 56-3 (not shown) on the circuit board 76 and the male member 56-3 (not shown) on the underside of the coupling means 22 is aligned with the female member 58-3 (not shown) located on the circuit board 60, and thereafter, the associated actuating means 62 on these female connectors are pushed inwardly to effect the actual connections between these male and female members.

After the circuit board 20 is supported in the supporting means 18, the supporting means 18 is detachably secured to the support structure 14. To effect the electrical connection of the circuit board 20 to the device 12, the male member 56-5 of the coupler 102 is inserted into the female member 58-1 of the circuit board 20, and the coupler 78 is positioned beneath the circuit board 20 (as viewed in FIG. 1) to enable the male member 56-1 on the underside of circuit board 20 to engage the female member 58 on the coupler 78 and then the actuating means 62 on the female members 58 and 58-1 are pushed inwardly to effect the actual connection between the associated aligned contacts on the male and female members. Testing or servicing of the circuit board 20 may then be effected while it is operatively connected to the device 12.

The means for securing the supporting means 18 to the support structure 14 is best shown in FIG. 2, and includes a right angled bracket 128, with one such bracket being secured to each side of the support structure as shown in FIG. 1. One portion 130 of the bracket 128 has a plurality of apertured mounting posts 132 secured thereto to receive the locking pins 48 and 50 as shown in FIG. 2. The locking pins 48 and 50 have portions 134 on the ends of the associated shafts 52 which can be pivoted at a right angle to the associated shafts as is customarily done to detachably secure the locking pins 48 and 50 and supporting means 18 to the support structure 114. Fasteners 136 and 138 secure the bracket 128 to the support structure 14.

As an alternative construction, the fasteners 138 for each of the brackets 128 can be replaced by a locking pin (not shown but similar to locking pin 48) which can be removed to permit the bracket 128 (FIG. 2) to be rotated in a clockwise direction (as represented by dashed arrow 141 in FIG. 2) until the hole 140 in the bracket 128 is aligned with the hole 142 in the support structure 14, and when so aligned, a locking pin may be inserted through these aligned holes to support the supporting means 18 in a vertical position as viewed in FIG. 2. This will facilitate testing or servicing of components which are located on the underside of a circuit board (when viewed from the position shown in FIG. 2) which circuit board is supported in the supporting means 18.

What is claimed is:

1. In a device having a support structure and a plurality of circuit boards slidably mounted in spaced parallel relationship therein; at least some of said circuit boards forming a group which are electrically intercoupled by means comprising a first member on one side of a said circuit board in said group and a second member located on the opposite side thereof, whereby the first member on said one side of one of said circuit boards is brought into coupling relationship with a said second member of a first adjacent said circuit board in said group and the second member located on said opposite side of said one of said circuit boards is brought into coupling relationship with a said first member on a second adjacent said circuit board in said group as said one of said circuit boards in said group is moved into said support structure; the improvement comprising:

means for supporting one of said circuit boards from said group (hereinafter referred to as the board under test) after it is removed from its space within said support structure;

a coupling means having a said first member on one side thereof and a said second member located on the opposite side thereof whereby the first member of said coupling means is brought into coupling relationship with the second member of said first adjacent circuit board and the second member on said coupling means is brought into coupling relationship with the first member on said second adjacent circuit board as said coupling means is moved into said space from which said board under test is removed;

first means for electrically coupling said first member on said coupling means with said first member on said board under test, and second means for electrically coupling said second member on said coupling means with said second member on said board under test whereby said board under test is operatively coupled to said first and second adjacent circuit boards to facilitate testing, servicing and the like on said board under test.

2. The improvement as claimed in claim 1 in which said first means includes a second member in electrical coupling relationship with said first member on said board under test and also includes means electrically connecting said last named second member with said first member on said coupling means.

3. The improvement as claimed in claim 2 in which said second means includes a first member in electrical coupling relationship with said second member on said board under test and also includes means electrically connecting said last named first member with said second member on said coupling means.

4. The improvement as claimed in claim 3 in which said first and second members are complementary male and female members, respectively, and said first and second members comprise a connector of the zero-insertion-force type, and said coupling means is an extender board having the same overall physical dimensions as said board under test.

5. The improvement as claimed in claim 1 in which said supporting means comprises:

a pair of support members having recesses therein;

connecting means to maintain said support members in spaced parallel relationship to receive and to support said board under test in said recesses;

means for locking said support members in said spaced parallel relationship with said board under test therein; and means for securing said support members to said support structure.

6. The improvement as claimed in claim 5 in which said connecting means include first and second rods with each said rod having an annular recess formed near each end thereof;

each of said support members having first and second holes therein in one end thereof to receive said first and second rods respectively and also having third and fourth holes in said end to at least partially intersect said first and second holes, respectively;

said locking means including first and second locking pins to pass through said third and fourth holes, respectively, and to engage said annular recesses in the associated ends of said first and second rods, respectively, to maintain said support members in said spaced parallel relationship.

7. The improvement as claimed in claim 6 in which said securing means includes at least two locating supports with each said locating support having a hole passing therethrough to receive an associated said first locking pin and with said locating supports being secured to opposed sides of said support structure;

said first locking pins associated with said support members being long enough to pass through the associated said third holes and through said hole in the associated said locating support; and said first locking pins having means thereon to detachably secure said supporting means with said board under test therein to said support structure.

8. The combination comprising:

a device having a support structure and a plurality of circuit boards slidably mounted in spaced parallel relationship therein; at least some of said circuit boards forming a group which are electrically intercoupled by means comprising a first member on one side of a said circuit board in said group and a second member located on the opposite side thereon, whereby the first member on said one side of one of said circuit boards is brought into coupling relationship with a said second member of a first adjacent said circuit board in said group and the second member located on said opposite side of said one of said circuit boards is brought into coupling relationship with a said first member on a second adjacent said circuit board in said group as said one of said circuit boards in said group is moved into said support structure;

means for supporting one of said circuit boards from said group (hereinafter referred to as the board under test) after it is removed from its space within said support structure;

a coupling means having a said first member on one side thereof and a said second member located on the opposite side thereof whereby the first member of said coupling means is brought into coupling relationship with the second member of said first adjacent circuit board and the second member on said coupling means is brought into coupling relationship with the first member on said second adjacent circuit board as said coupling means is moved into said space from which said board under test is removed;

first means for electrically coupling said first member on said coupling means with said first member on said board under test, and second means for electrically coupling said second member on said coupling means with said second member on said board under test whereby said board under test is operatively coupled to said first and second adjacent circuit boards to facilitate testing, servicing and the like on said board under test.

9. A means for supporting a planar member adjacent to a support structure comprising:

first and second support members with said first and second support members each having a recess therein to receive an opposed edge of said planar member;

each said first and second support members having first, second, third and fourth holes in one end thereof, with said third and fourth holes being aligned to at least partially intersect said first and second holes, respectively;

first and second rods, with each said rod having an annular recess formed near each end thereof;

first and second locking pins for each said support member to pass through the associated said third and fourth holes, respectively, to engage the associated said annular recesses of said first and second rods, respectively, when the ends of said first and second rods are inserted in the associated first and second holes, respectively, to thereby maintain said first and second support members in spaced parallel relationship and to also support said opposed edges of said planar member in said recesses; and means for securing said supporting means to said support structure.

* * * * *